United States Patent
Tsuto

(10) Patent No.: US 9,262,376 B2
(45) Date of Patent: Feb. 16, 2016

(54) TEST APPARATUS AND TEST METHOD

(71) Applicant: Masaru Tsuto, Tokyo (JP)

(72) Inventor: Masaru Tsuto, Tokyo (JP)

(73) Assignee: ADVANTEST CORPORATION (JP)

(*) Notice: Subject to any disclaimer, the term of this patent is extended or adjusted under 35 U.S.C. 154(b) by 476 days.

(21) Appl. No.: 13/734,211

(22) Filed: Jan. 4, 2013

(65) Prior Publication Data

US 2013/0158905 A1 Jun. 20, 2013

Related U.S. Application Data

(63) Continuation of application No. PCT/JP2010/004444, filed on Jul. 7, 2010.

(51) Int. Cl.
| | |
|---|---|
| *H04B 3/46* | (2015.01) |
| *G06F 17/00* | (2006.01) |
| *G01R 31/319* | (2006.01) |

(Continued)

(52) U.S. Cl.
CPC ............ *G06F 17/00* (2013.01); *G01R 31/2601* (2013.01); *G01R 31/31908* (2013.01); *G01R 31/31726* (2013.01)

(58) Field of Classification Search
CPC ............ H04B 3/00; H04B 3/46; H04B 3/462; H04B 10/07; H04B 10/075; H04B 10/079; H04B 10/0795; H04B 10/07955; H04B 10/07957; H04B 10/0799; H04B 17/00; H04B 17/0085; H04B 17/10; H04B 17/101; H04B 17/102; H04B 17/11; H04B 17/14; H04B 17/15; H04B 17/16; H04B 17/17; H04B 17/18; H04B 17/19; H04B 17/20; H04B 17/21; H04B 17/24; H04B 17/29
See application file for complete search history.

(56) References Cited

U.S. PATENT DOCUMENTS

| | | | | |
|---|---|---|---|---|
| 5,412,663 | A | * | 5/1995 | Kromer et al. ................. 714/724 |
| 5,991,232 | A | * | 11/1999 | Matsumura et al. ........ 365/233.1 |
| 6,378,098 | B1 | | 4/2002 | Yamashita |

(Continued)

FOREIGN PATENT DOCUMENTS

| | | |
|---|---|---|
| CN | 1525490 | 9/2004 |
| CN | 1963552 | 5/2007 |

(Continued)

OTHER PUBLICATIONS

International Search Report for International Patent Application No. PCT/JP2010/004444, mailed on Oct. 12, 2010, with an English translation thereof.
International Preliminary Examination Report on Patentability for International Patent Application No. PCT/JP2010/004444, issued on Feb. 12, 2013, with an English translation thereof.

(Continued)

*Primary Examiner* — Siu Lee
(74) *Attorney, Agent, or Firm* — Cantor Colburn LLP

(57) ABSTRACT

A synchronization pattern generating unit generates a synchronization pattern required for a clock recovery unit which has been built into a DUT to maintain a link with an external circuit. A gate signal generating unit generates a gate signal which is asserted in a period in which a vector pattern is to be supplied to the DUT. In a first mode, a pattern selecting unit is configured such that it outputs the vector pattern during a period in which the gate signal is asserted and outputs a fixed output level during a period in which the gate signal is negated. In a second mode, the pattern selecting unit is configured such that it outputs the vector pattern during a period in which the gate signal is asserted and outputs the synchronization pattern during a period in which the gate signal is negated.

4 Claims, 4 Drawing Sheets

(51) Int. Cl.
   *G01R 31/26* (2014.01)
   *G01R 31/317* (2006.01)

(56) References Cited

U.S. PATENT DOCUMENTS

| | | | |
|---|---|---|---|
| 6,523,136 B1 * | 2/2003 | Higashida | 714/30 |
| 2002/0170003 A1 * | 11/2002 | Hirabayashi | 714/42 |
| 2005/0240842 A1 * | 10/2005 | Yonaga | 714/724 |
| 2008/0018345 A1 | 1/2008 | Chiba et al. | |
| 2008/0265934 A1 | 10/2008 | Ogawa | |

FOREIGN PATENT DOCUMENTS

| | | |
|---|---|---|
| CN | 101038320 | 9/2007 |
| JP | 11-264857 | 9/1999 |
| JP | 2008-28628 | 2/2008 |

OTHER PUBLICATIONS

Office action dated Jun. 3, 2014 from corresponding Chinese Patent Application No. 2010800679169 and its English summary provided by the applicants.

* cited by examiner

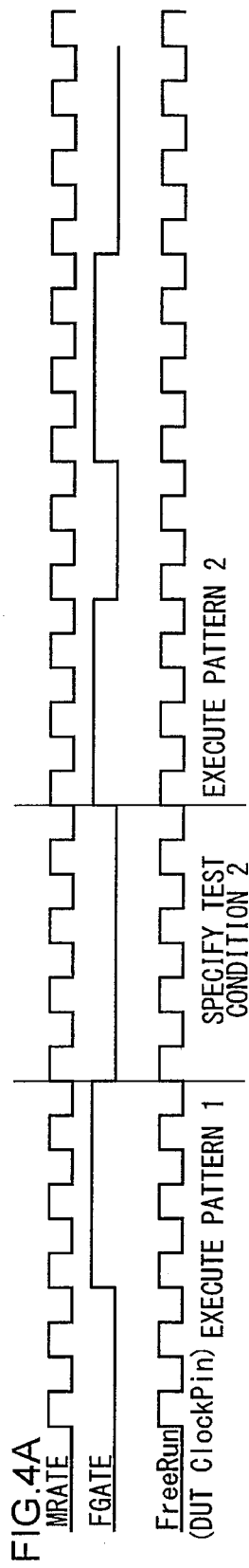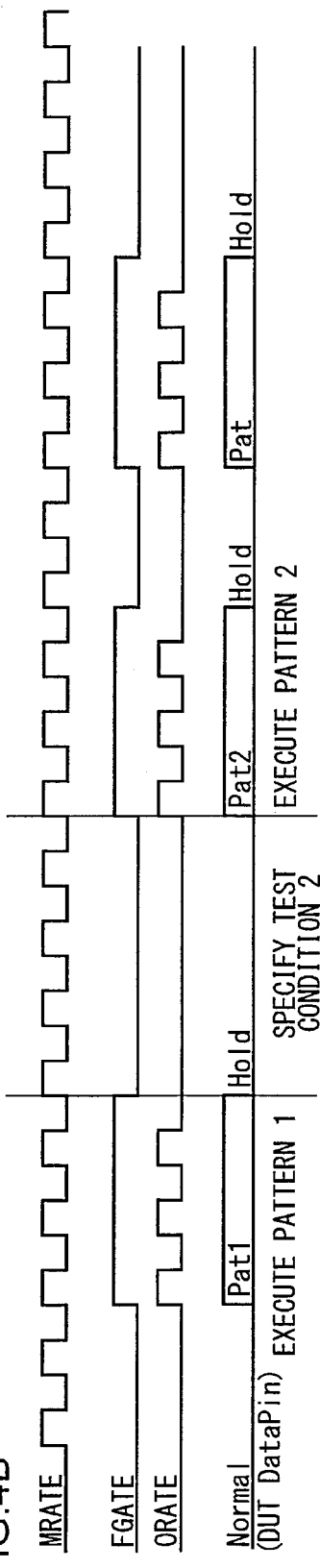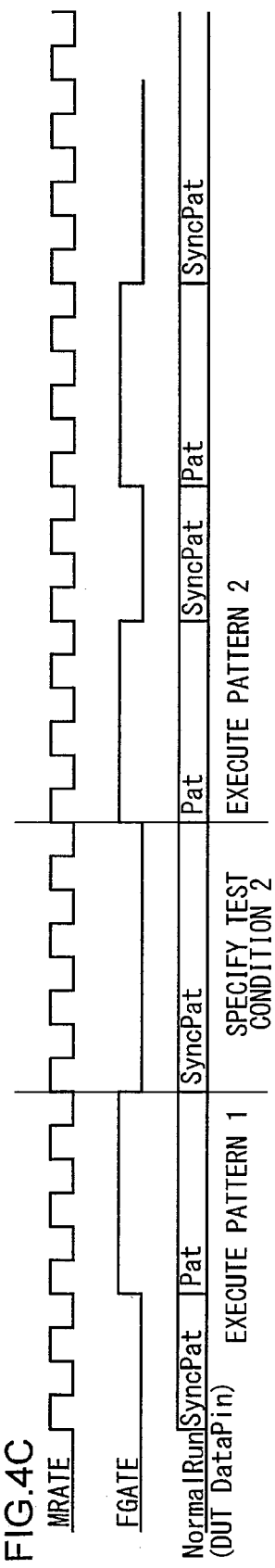

TEST APPARATUS AND TEST METHOD

CROSS REFERENCE TO RELATED APPLICATIONS

This application is a continuation of International Application No. PCT/JP2010/004444, filed on Jul. 7, 2010, the disclosure of which is hereby incorporated by reference in it entirety.

BACKGROUND OF THE INVENTION

1. Field of the Invention

The present invention relates to a test apparatus configured to test a semiconductor device.

2. Description of the Related Art

After a semiconductor device is manufactured, a semiconductor test apparatus (which will also be referred to simply as a "test apparatus" hereafter) is used in order to test whether or not the semiconductor device thus manufactured operates normally. The test apparatus is configured to receive a signal (signal under test) output from a DUT (device under test), and to compare the signal under test with an expected value so as to judge the quality (Pass/Fail) of the DUT. Also, the test apparatus is configured to measure the amplitude margin and/or the timing margin of the signal under test.

In some cases, a PLL (Phase Locked Loop) circuit or a DLL (Delay Locked Loop) circuit configured to receive a clock signal from an external circuit, i.e., a test apparatus, and to generate an internal clock signal using the clock signal as a reference signal is built into such a DUT. In order to test such a DUT, the test apparatus is configured to output a vector pattern to a normal pin of the DUT, and to supply a clock signal to a clock terminal of the DUT.

Description will be made below regarding a situation in which, after a test is executed using a given test pattern, the test condition is switched, and a test is executed under the test condition thus switched. In this case, such a test condition switching operation requires a certain amount of switching time. If the supply of the clock signal to the DUT is stopped in the test condition switching operation, the PLL circuit or otherwise the DLL circuit switches from the locked state to the unlocked state. Thus, before a test pattern is supplied in the next operation, there is a need to again lock the PLL circuit or the DLL circuit, leading to a problem of a long test time.

Conceivable methods used to solve such a problem include a method in which, during a period of time in which the supply of a test pattern is stopped, i.e., during a period of time in which the test condition is switched, a clock signal is continuously output to the clock input pin of the DUT. This ensures that the PLL circuit or the DLL circuit built into the DUT is kept in the locked state. FIG. 1 is a flowchart showing an operation for maintaining the locked state of the PLL/DLL circuit built into the DUT.

Also, a transmission method in which a clock signal is embedded in a data signal has become popular. Examples of such a transmission method include a CDR (Clock Data Recovery) method, and a packet method. In a case of testing a DUT employing such a transmission method, the PLL circuit or the DLL circuit cannot be maintained in the locked state using the aforementioned test method. This is because, when the test pattern is stopped in the test condition switching, the clock signal, which is configured as data embedded in the data signal, is not supplied.

SUMMARY OF THE INVENTION

The present invention has been made in order to solve such a problem. Accordingly, it is an exemplary purpose of an embodiment of the present invention to provide a test apparatus which is capable of maintaining the locked state of a PLL/DLL circuit of a device under test during a period of time in which a test condition is set.

An embodiment of the present invention relates to a test apparatus. The test apparatus comprises: a vector pattern generating unit configured to generate a vector pattern which specifies a vector of a device under test; a synchronization pattern generating unit configured to generate a synchronization pattern required for a clock recovery unit which has been built into the device under test to maintain a link with an external circuit; a gate signal generating unit configured to generate a gate signal which is asserted during a period of time in which the vector pattern is to be supplied to the device under test; and a pattern selecting unit configured to receive the vector pattern, a clock signal, the synchronization pattern, and a control signal which specifies a mode. The pattern selecting unit is configured to operate such that, (1) in a first mode, it outputs the vector pattern during a period of time in which the gate signal is asserted and outputs a fixed output level during a period of time in which the gate signal is negated, and such that, (2) in a second mode, it outputs the vector pattern during a period of time in which the gate signal is asserted and outputs the synchronization pattern during a period of time in which the gate signal is negated.

With such an embodiment, in a case of testing a DUT including an interface that employs an embedded-clock method such as CDR method, packet method, or the like, a synchronization pattern is supplied during a period of time in which the supply of a vector pattern is stopped due to switching of the test condition or the like. Thus, such an arrangement is capable of maintaining the locked state of a PLL/DLL circuit built into the DUT.

Also, the test apparatus may further comprise a clock signal generating unit configured to generate a clock signal. Also, the pattern selecting unit may be configured such that, (3) in a third mode, it outputs the clock signal regardless of the level of the gate signal.

In a case of testing a DUT having an interface configured to transmit a clock signal and a data signal via separate respective lines, by setting, to the third mode, the channel to which a clock input pin of the DUT is assigned, such an arrangement is capable of maintaining the locked state of the PLL/DLL circuit built into the DUT during a period of time in which the test condition is switched.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 4A through 4C are waveform diagrams showing the operations in the third mode, the first mode, and the second mode, respectively.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, a state represented by the phrase "the member A is connected to the member B" includes a state in which the member A is indirectly connected to the member B via another member that does not affect the electric connection therebetween, in addition to a state in which the member A is physically and directly connected to the member B. Similarly, a state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 1:
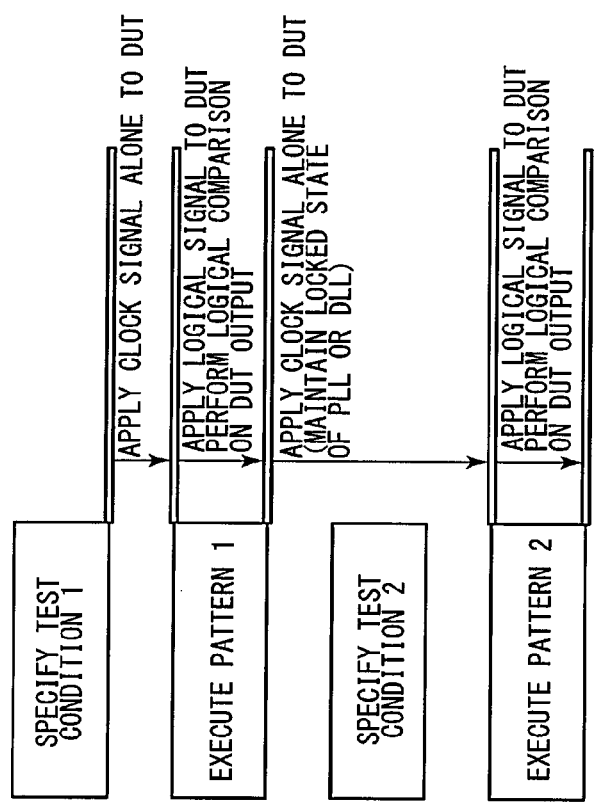
FIG. 1 is a flowchart which shows an operation for maintaining the locked state of a PLL/DLL circuit built into a DUT.
Figure 2:
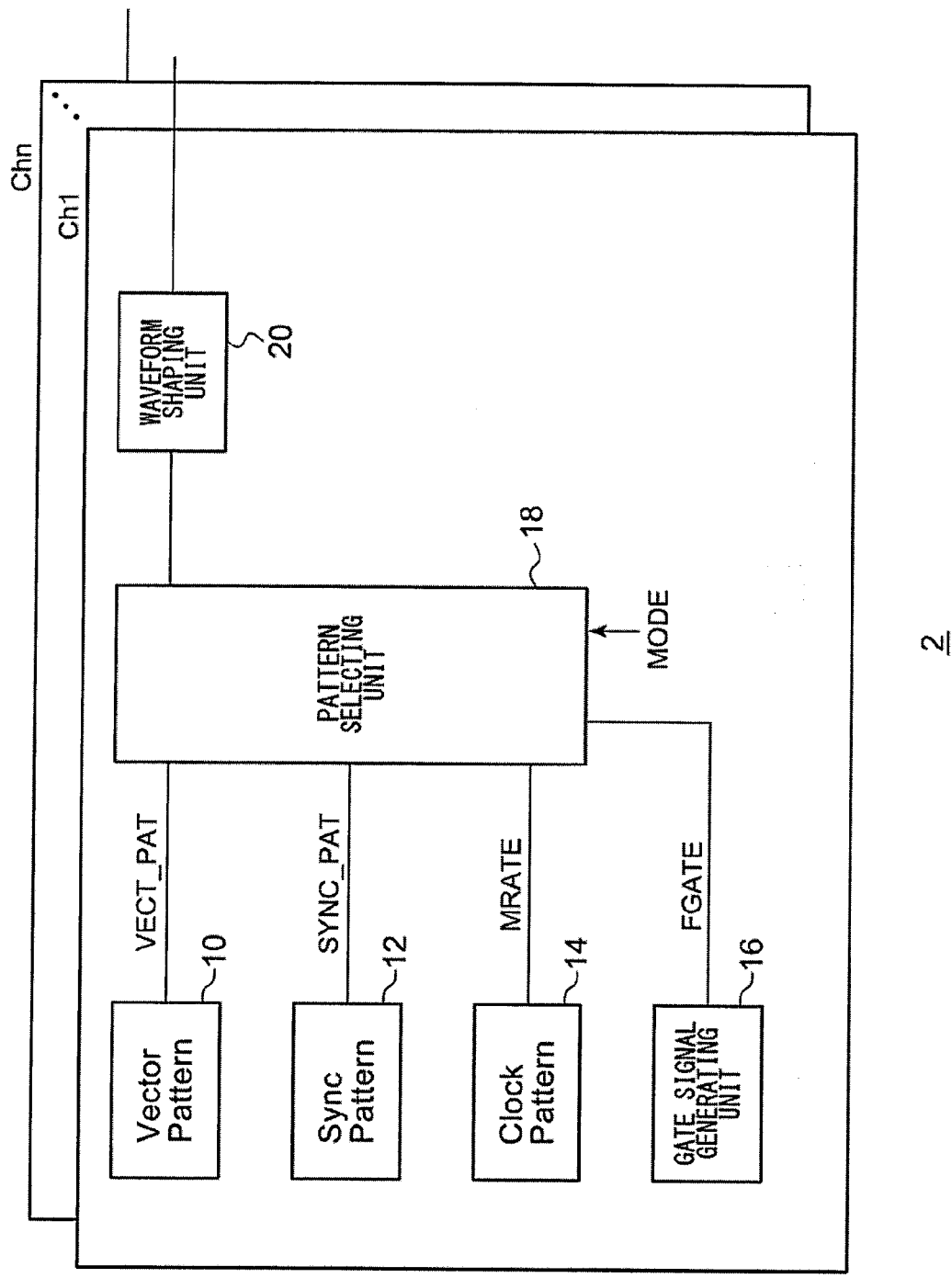
FIG. 2 is a block diagram showing a configuration of a test apparatus according to an embodiment.
Figure 3A:
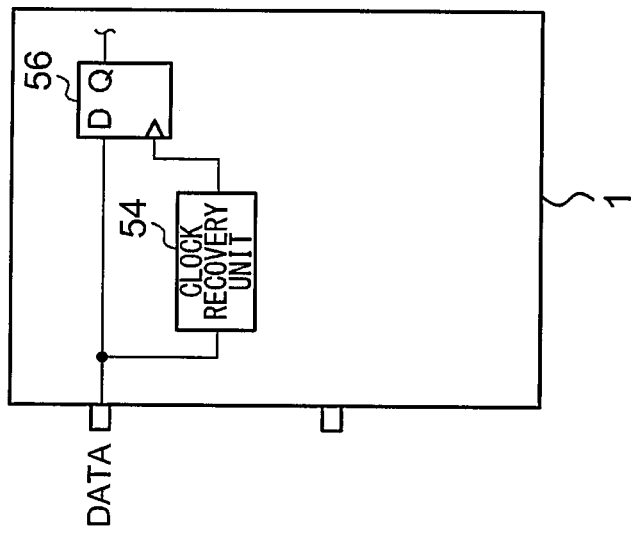
FIGS. 3A and 3B are diagrams each showing an example configuration of a DUT to be tested by the test apparatus.
Figure 3B:
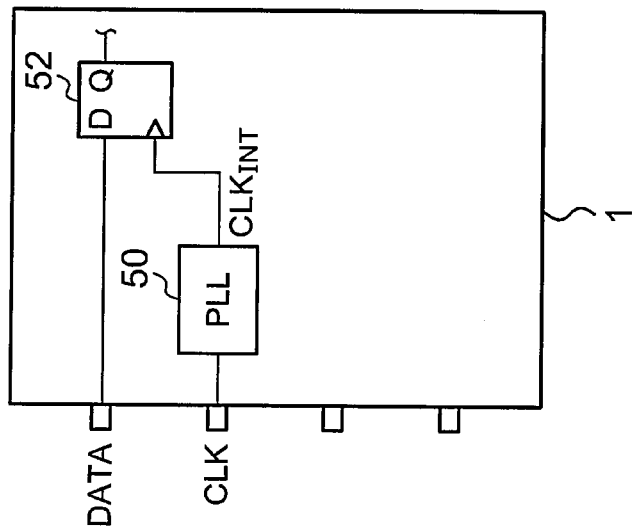

FIG. 2 is a block diagram which shows a configuration of a test apparatus 2 according to an embodiment. FIGS. 3A and 3B are diagrams each showing an example configuration of a DUT 1 to be tested by the test apparatus 2. First, description will be made regarding the configuration and the operation of the DUT 1 with reference to FIGS. 3A and 3B. The DUT 1 shown in FIG. 3A includes a so-called two-line serial interface. Specifically, the DUT 1 includes a clock input pin configured to receive a clock signal CLK, and a data input pin configured to receive a data signal DATA. A PLL circuit (or otherwise a DLL circuit) 50 is built into the DUT 1, and is configured to multiply the frequency of the clock signal CLK so as to generate an internal clock signal $CLK_{INT}$. The flip-flop 52 latches the data signal DATA using the internal clock $CLK_{INT}$.

FIG. 3B shows another configuration of the DUT 1. Serial data DATA to be input to the DUT 1 is supplied as encoded data which is encoded using the 8B/10B method, for example. With such an arrangement, the clock signal CLK is embedded in the serial data DATA. The DUT 1 includes a clock recovery unit 54 configured to extract and recover the clock signal CLK from the serial data DATA. The clock recovery unit 54 includes a PLL circuit or otherwise a DLL circuit configured to detect a change point in the serial data that occurs in a cyclical manner, and to use the change point thus detected as a reference point. The flip-flop 56 latches the serial data DATA using the internal clock signal $CLK_{INT}$ thus recovered.

Returning to FIG. 2, the test apparatus 2 is configured to be capable of testing DUTs having various kinds of interfaces as shown in FIG. 3.

The test apparatus 2 includes multiple channels Ch1 through Chn. Each channel is configured in the same manner. Each channel is connected to the corresponding pin of the DUT.

Each channel includes a vector pattern generating unit 10, a synchronization pattern generating unit 12, a clock pattern generating unit 14, a gate signal generating unit 16, a pattern selecting unit 18, and a waveform shaper 20.

The vector pattern generating unit 10 generates a vector pattern VECT_PAT which specifies the vector (state) of the DUT. The synchronization pattern generating unit 12 generates a synchronization pattern SYNC_PAT, which is required by the clock recovery unit built into the DUT to maintain a link with an external circuit, i.e., to maintain the locked state. The synchronization pattern SYNC_PAT corresponds to a so-called idle packet, and includes a clock signal in the form of an embedded signal. The synchronization pattern generating unit 12 repeatedly generates a one packet length pattern (e.g., a 32-cycle vector) defined beforehand. Thus, such an arrangement requires only a small amount of memory capacity to define such a synchronization pattern SYNC_PAT. The clock pattern generating unit 14 generates a clock pattern (master rate signal) MRATE. The gate signal generating unit 16 generates a gate signal FGATE which is asserted (set to high level) during a period of time in which the vector pattern VECT_PAT is to be supplied to the DUT.

The pattern selecting unit 18 receives the vector pattern signal VECT_PAT, the clock signal MRATE, the synchronization pattern SYNC_PAT, and a control signal MODE which specifies a mode.

The pattern selecting unit 18 operates in the following three modes.

(1) First Mode (Normal Pin Mode)

The pattern selecting unit 18 is configured to output the vector pattern VECT_PAT during a period of time in which the gate signal FGATE is asserted, and to set its output level to a fixed level, e.g., low level during a period of time in which the gate signal FGATE is negated (set to low level).

(2) Second Mode (Keep Alive Pin Mode)

The pattern selecting unit 18 is configured to output the vector pattern VECT_PAT during a period of time in which the gate signal FGATE is asserted, and to output the synchronization pattern SYNC_PAT during a period of time in which the gate signal FGATE is negated.

(3) Third Mode (Free Run Mode)

The pattern selecting unit 18 outputs a clock signal MRATE regardless of the level of the gate signal FGATE.

The above is the configuration of the test apparatus 2. Next, description will be made regarding the operation of the test apparatus 2. FIGS. 4A through 4C are waveform diagrams showing the operations in the third mode, the first mode, and the second mode, respectively. Each channel Ch is configured such that its mode can be set independently according to the kind of DUT connected to the channel, the format of the interface, and the kind of pin.

In a case of testing the DUT 1 shown in FIG. 3A, the channel connected to the clock input pin of the DUT is set to the third mode. Moreover, the channel connected to the data input pin of the DUT is set to the first mode.

Thus, in a case of testing a DUT having a two-line serial interface, such an arrangement allows the clock signal MRATE to be supplied to the clock input pin of the DUT without interruption even in a period of time in which the test condition is set. Thus, such an arrangement is capable of maintaining the locked state of the PLL circuit 50 of the DUT.

In a case of testing the DUT 1 shown in FIG. 3B, the channel connected to the data input pin of the DUT is set to the second mode.

With such an arrangement, even if the pattern supply is stopped in a period of time in which the test condition is set, the synchronization pattern SYNC_PAT instead continues to be supplied to the clock recovery unit 54. Thus, such an arrangement allows the clock recovery unit 54 to be maintained in the locked state.

As described above, the test apparatus 2 according to the embodiment allows a PLL circuit or a DLL circuit built into a DUT to be maintained in the locked state in a case of testing such a DUT that can have various kinds of interfaces.

While the preferred embodiments of the present invention have been described using specific terms, such description is for illustrative purposes only, and it is to be understood that changes and variations may be made without departing from the spirit or scope of the appended claims.

What is claimed is:

1. A test apparatus comprising:
a first pattern generating circuit that generates a vector pattern which specifies a vector of a device under test;
a second pattern generating circuit that generates a synchronization pattern required for a clock recovery circuit which has been built into the device under test to maintain a link with an external circuit;
a signal generating circuit that generates a gate signal which is asserted during a period of time in which the vector pattern is to be supplied to the device under test; and
a selector circuit that receives the vector pattern, the synchronization pattern, and a control signal which specifies a mode, and to operate such that, in a first mode, it outputs the vector pattern during the period of time in which the gate signal is asserted and outputs a fixed output level during a period of time in which the gate signal is negated, and such that, in a second mode, it outputs the vector pattern during the period of time in which the gate signal is asserted and outputs the synchronization pattern during the period of time in which the gate signal is negated.

2. A test apparatus according to claim 1, further comprising a clock generating circuit that generates a clock signal, wherein the selector circuit outputs the clock signal regardless of the level of the gate signal in a third mode.

3. A test method for supplying a signal to a device under test, the test method comprising:
generating a vector pattern which specifies a vector of a device under test;
generating a synchronization pattern required for a clock recovery circuit which has been built into the device under test to maintain a link with an external circuit;
generating a gate signal which is asserted during a period of time in which the vector pattern is to be supplied to the device under test;
selecting a mode;
in a first mode, outputting the vector pattern during the period of time in which the gate signal is asserted, and outputting a fixed output level during a period of time in which the gate signal is negated; and
in a second mode, outputting the vector pattern during the period of time in which the gate signal is asserted, and outputting the synchronization pattern during the period of time in which the gate signal is negated.

4. A test method according to claim 3, further comprising:
generating a clock signal; and
in a third mode, outputting the clock signal regardless of the level of the gate signal.

* * * * *